US 6,583,439 B2

(12) United States Patent
Yamazaki et al.

(10) Patent No.: US 6,583,439 B2
(45) Date of Patent: Jun. 24, 2003

(54) SEMICONDUCTOR DEVICE

(75) Inventors: Shunpei Yamazaki, Tokyo (JP); Jun Koyama, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/809,672

(22) Filed: Mar. 15, 2001

(65) Prior Publication Data
US 2001/0019130 A1 Sep. 6, 2001

Related U.S. Application Data

(62) Division of application No. 09/309,966, filed on May 11, 1999, now Pat. No. 6,236,063.

(30) Foreign Application Priority Data
May 15, 1998 (JP) .......................... 10-152318

(51) Int. Cl.[7] ................ H01L 29/04; H01L 31/036; H01L 31/20
(52) U.S. Cl. ................................ 257/59; 257/72
(58) Field of Search ............... 257/59, 72, 57, 257/66, 222, 223, 233; 349/116, 42, 43, 45; 348/308; 345/90, 92, 104, 102

(56) References Cited

U.S. PATENT DOCUMENTS

| 4,517,733 A | | 5/1985 | Hamano ................ 438/59 |
| 5,247,289 A | * | 9/1993 | Matsueda ................ 345/98 |
| 5,315,101 A | | 5/1994 | Hughes et al. ........... 250/208.1 |
| 5,349,174 A | | 9/1994 | Van Berkel et al. ..... 250/208.1 |
| 5,446,290 A | * | 8/1995 | Fujieda et al. ............. 250/556 |
| 5,539,461 A | * | 7/1996 | Andoh et al. ............... 348/308 |
| 5,563,427 A | * | 10/1996 | Yudasaka et al. ............ 257/72 |
| 5,589,847 A | | 12/1996 | Lewis ..................... 345/98 |
| 5,650,637 A | | 7/1997 | Kodaira et al. ............. 257/72 |
| 5,657,100 A | | 8/1997 | Yamamoto et al. .......... 349/41 |
| 5,684,318 A | | 11/1997 | Ayres et al. ............... 257/334 |
| 5,717,224 A | | 2/1998 | Zhang ..................... 257/57 |
| 5,831,258 A | * | 11/1998 | Street .................... 250/208.1 |
| 5,991,467 A | | 11/1999 | Kamiko .................... 382/312 |
| 6,028,581 A | * | 2/2000 | Umeya .................... 345/104 |

FOREIGN PATENT DOCUMENTS

| JP | 6-018845 | | 1/1994 | |
| JP | 6-022250 | | 1/1994 | |
| JP | 406334910 A | * | 12/1994 | .......... H04N/5/232 |

OTHER PUBLICATIONS

Full English translation re Japanese Patent Application No. JP 6–018845, published Jan. 28, 1994.
Full English translation re Japanese Patent Application No. JP 6–022250, published Jan. 28, 1994.

* cited by examiner

Primary Examiner—Shouxiang Hu
(74) Attorney, Agent, or Firm—Cook, Alex, McFarron, Manzo, Cummings & Mehler, Ltd.

(57) ABSTRACT

There is provided a semiconductor device including a picture display function and a picture capturing function on the same substrate. The semiconductor device includes a pixel matrix, an image sensor, and a peripheral circuit for driving those, which are provided on the same substrate. Moreover, in the semiconductor device, the structure/manufacturing process of the image sensor is made coincident with the structure/manufacturing process of the pixel matrix and the peripheral driver circuit, so that the semiconductor device can be manufactured at low cost.

20 Claims, 6 Drawing Sheets

SEMICONDUCTOR DEVICE

This application is a divisional of U.S. application Ser. No. 09/309,966, filed on May 11, 1999, now U.S. Pat. No. 6,236,063.

BACKGROUND OF THE INVENTION

1. Field of the Invention

The present invention relates to a semiconductor device having both an image sensor function and a picture display function. More particularly, the present invention relates to an active matrix type semiconductor device constituted by a plurality of thin film transistors (TFTs) arranged in a matrix form.

2. Description of the Related Art

In recent years, a technique for a TFT using polycrystal silicon (polysilicon TFT) has been diligently studied. As a result, it becomes possible to form a driver circuit including a shift register circuit and the like by use of the polysilicon TFT, and an active matrix type liquid crystal panel in which a pixel region and a peripheral driver circuit for driving the pixel region are integrated on the same substrate has been put to practical use. Thus, a liquid crystal panel is miniaturized and its weight is lessened, and the liquid crystal panel is used as a display portion of various kinds of information equipment and portable equipment, such as a personal computer, a video camera, and a digital camera.

Recently, a pocket-sized small portable information processing terminal device (mobile computer) which is superior to a note-sized personal computer in portability and is inexpensive, becomes popular, and an active matrix type liquid crystal panel is used as its display portion. In such an information processing terminal device, data can be inputted from the display portion in a touch-pen system. However, it is necessary to connect it with a peripheral equipment for reading a picture, such as a scanner or a digital camera, in order to input character/drawing information on a sheet or image information. Thus, the portability of the information processing terminal device is vitiated. Moreover, an economical burden is imposed on users.

The active matrix type liquid crystal display device is also used for a display portion of a TV meeting system, a TV telephone, a terminal for the Internet, and the like. Although such a system or terminal includes a camera (CCD camera) for taking a picture of a dialogist or a user, a display portion and a reading portion (sensor portion) are separately manufactured, and are made into a module. Thus, the manufacturing cost is high.

SUMMARY OF THE INVENTION

The present invention has been made in view of the above problems, and therefore has an object of the invention to provide a semiconductor device including a pixel matrix, an image sensor, and a peripheral circuit for driving those, that is, a novel semiconductor device having both an image pickup function and a display function and made intelligent.

Another object of the present invention is to manufacture a novel intelligent semiconductor device at low cost by making the structure/manufacturing process of an image sensor coincident with the structure/manufacturing process of a pixel matrix and a peripheral driver circuit.

In order to solve the foregoing problems, the present invention adopts such a structure that a display semiconductor device for displaying a picture and a light receiving semiconductor device for capturing a picture are provided on the same substrate. The structure of the present invention is as follow.

According to an aspect of the present invention, a semiconductor device comprises an active matrix substrate including a plurality of pixels arranged in a matrix form and a plurality of sensor portions arranged in a matrix form; and a backlight; wherein each of the sensor portions comprises a photoelectric conversion element, and the backlight is to be used as a light source when an external picture is read. The above objects can be achieved by this.

According to another aspect of the present invention, a semiconductor device comprises an active matrix substrate including a plurality of pixels arranged in a matrix form and a plurality of sensor portions arranged in a matrix form; and a backlight; wherein each of the sensor portions includes a pixel reflecting electrode, the pixel reflecting electrode includes a plurality of window for allowing light to pass, each of the sensor portions comprises a photoelectric conversion element, and the backlight is to be used as a light source when an external picture is read. The above objects can be achieved by this.

DETAILED DESCRIPTION OF THE PREFERRED EMBODIMENTS

First, a typical embodiment of a semiconductor device of the present invention will be described below. However, the present invention is not limited to the embodiment described below.

Figure 1:
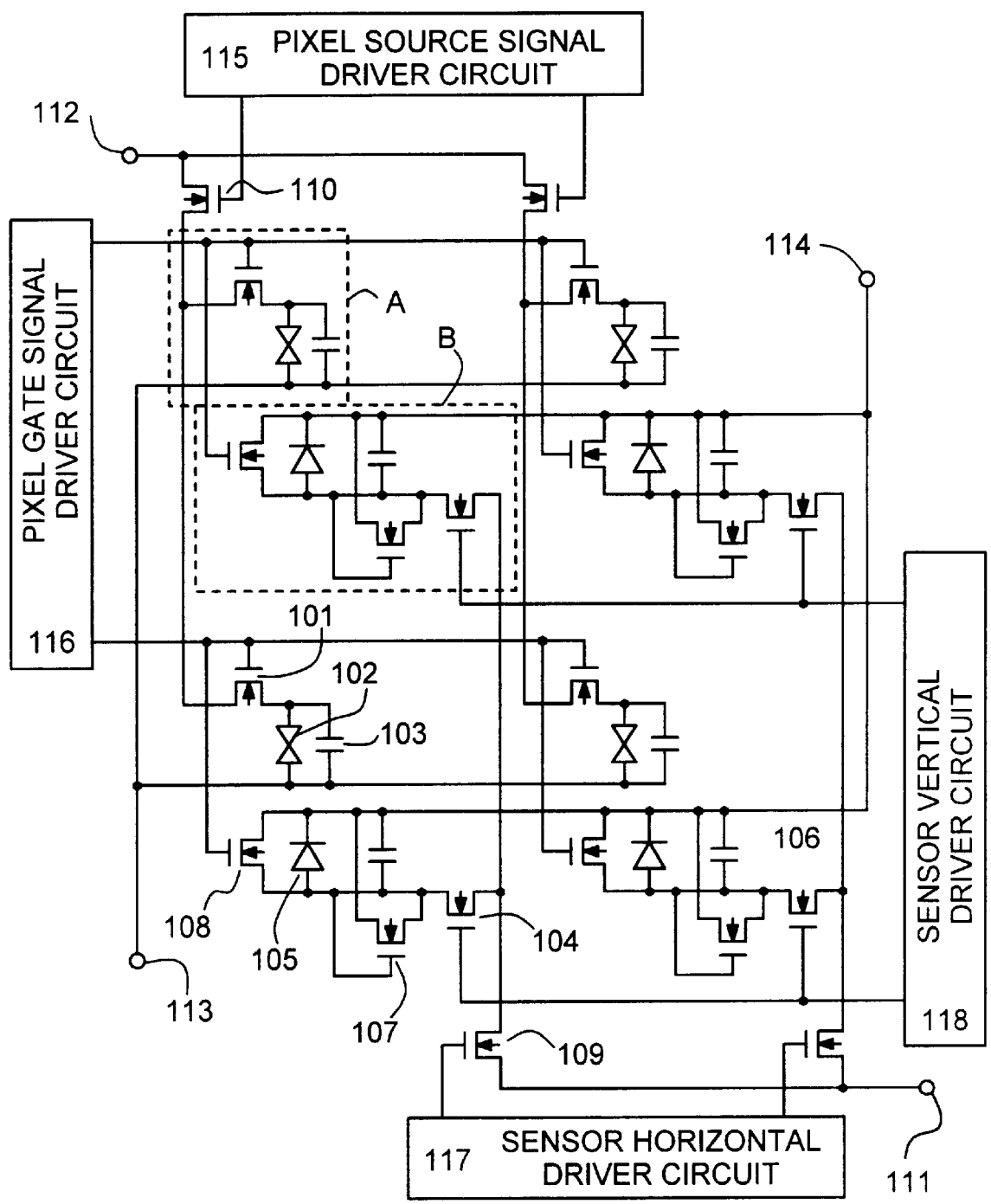
FIG. 1 is a circuit diagram of a semiconductor device of an embodiment of the present invention.

Reference will be made to FIG. 1. FIG. 1 shows an example of a circuit structure of a semiconductor device of the present invention. For convenience of explanation, FIG. 1 shows the circuit structure of the semiconductor device with 2×2 (vertical×horizontal) pixels. Peripheral circuits are simply shown with blocks.

Reference numeral 101 denotes a pixel TFT, 102 denotes a liquid crystal, 103 denotes an auxiliary capacitor. Various Known liquid crystal materials such as twisted nematic liquid crystal, polymer dispersion liquid crystal, ferroelectric liquid crystal, anti-ferroelectric liquid crystal, thresholdless antiferroelectric liquid crystal (TLAFLC) or a mixture of ferroelectric and anti*-ferroelectric liquid crystals may be use in the liquid crystal display of thin example.

Reference numeral 104 denotes a sensor TFT, 105 denotes a photodiode PD, 106 denotes an auxiliary capacitor, 107 denotes a signal amplifying TFT, 108 denotes a reset TFT, and 109 and 110 denote analog switches. The circuit constituted by these elements 101 to 108 will be called a matrix circuit. Further, the portion constituted by the elements 101 and 103 will be called a pixel region A, and the portion constituted by the elements 104, 105, 106, 107, and 108 will be called a sensor portion B. Reference numeral 111 denotes a sensor output signal line, and 112 denotes a picture input signal line. Reference numerals 113 and 114 denote fixed potential lines. Reference numeral 115 denotes a pixel source signal line side driver circuit, 116 denotes a pixel gate signal line side driver circuit, 117 denotes a sensor horizontal driver circuit, and 118 denotes a sensor vertical driver circuit.

In the semiconductor device-of the present invention, in the case where a picture is displayed, a picture signal (gradation voltage) inputted from the picture input signal line is supplied to the pixel TFT through the pixel source signal line side driver circuit 115 and the pixel gate signal line side driver circuit 116, and the liquid crystal sandwiched between a pixel electrode connected to the pixel TFT and an opposite electrode is driven, so that the picture can be displayed. In FIG. 1, although an analog driver circuit is shown for the pixel source signal line side driver circuit 115 and the pixel gate signal line side driver circuit 116, the invention is not limited to analog system. That is, a digital conversion circuit incorporating a D/A conversion circuit to process a digital image signal may be used.

Moreover, in the semiconductor device of the present invention, an incident external image (light signal) is read by the photodiode PD and is converted into an electric signal, and the image is captured by the sensor horizontal driver circuit 117 and the sensor vertical driver circuit 118. This image signal is captured in other peripheral circuits (memory, CPU, etc.) through the sensor output signal line 111.

Figure 2:
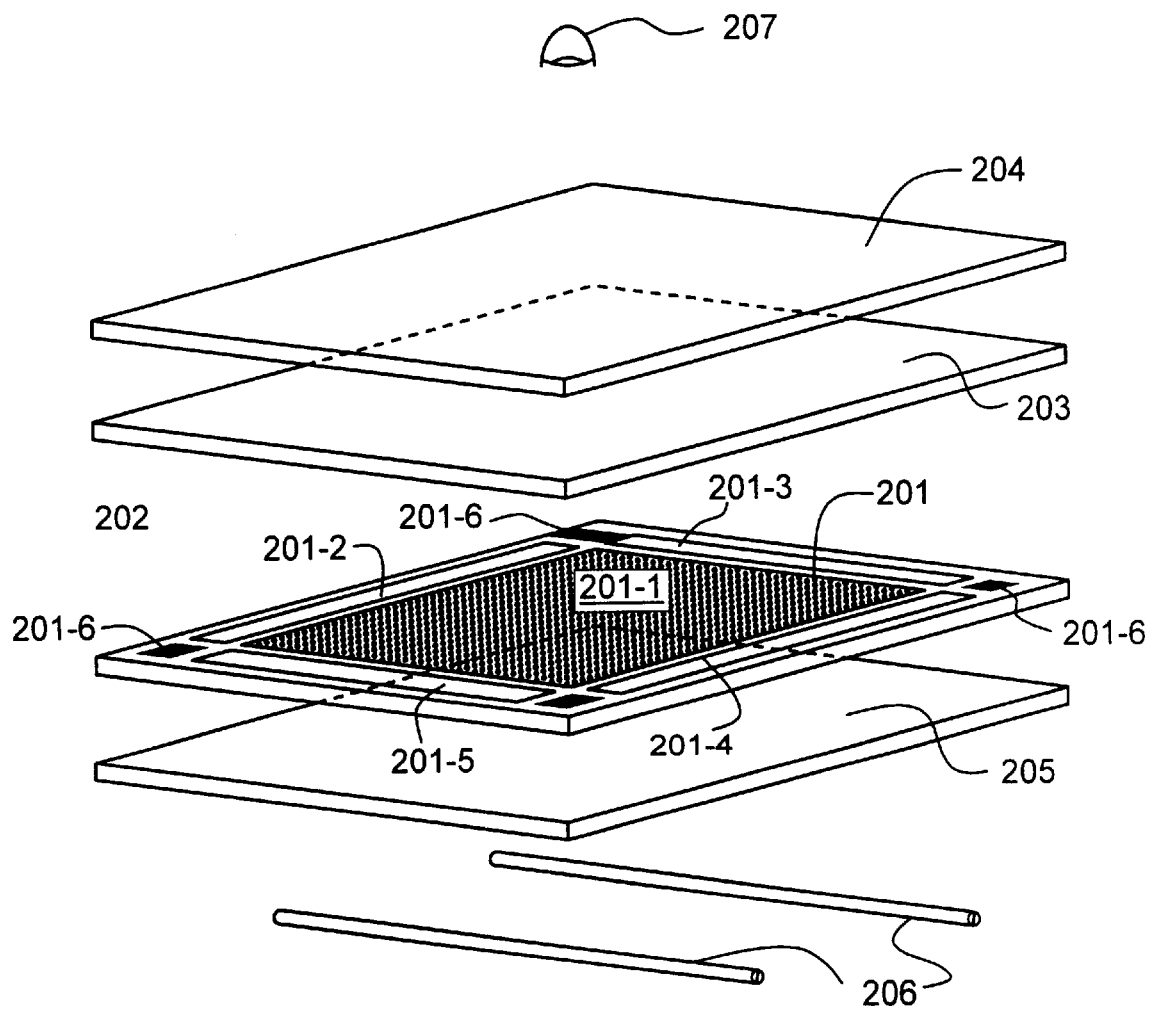
FIG. 2 is an analytic view of a semiconductor device of the present invention.
Figure 3:
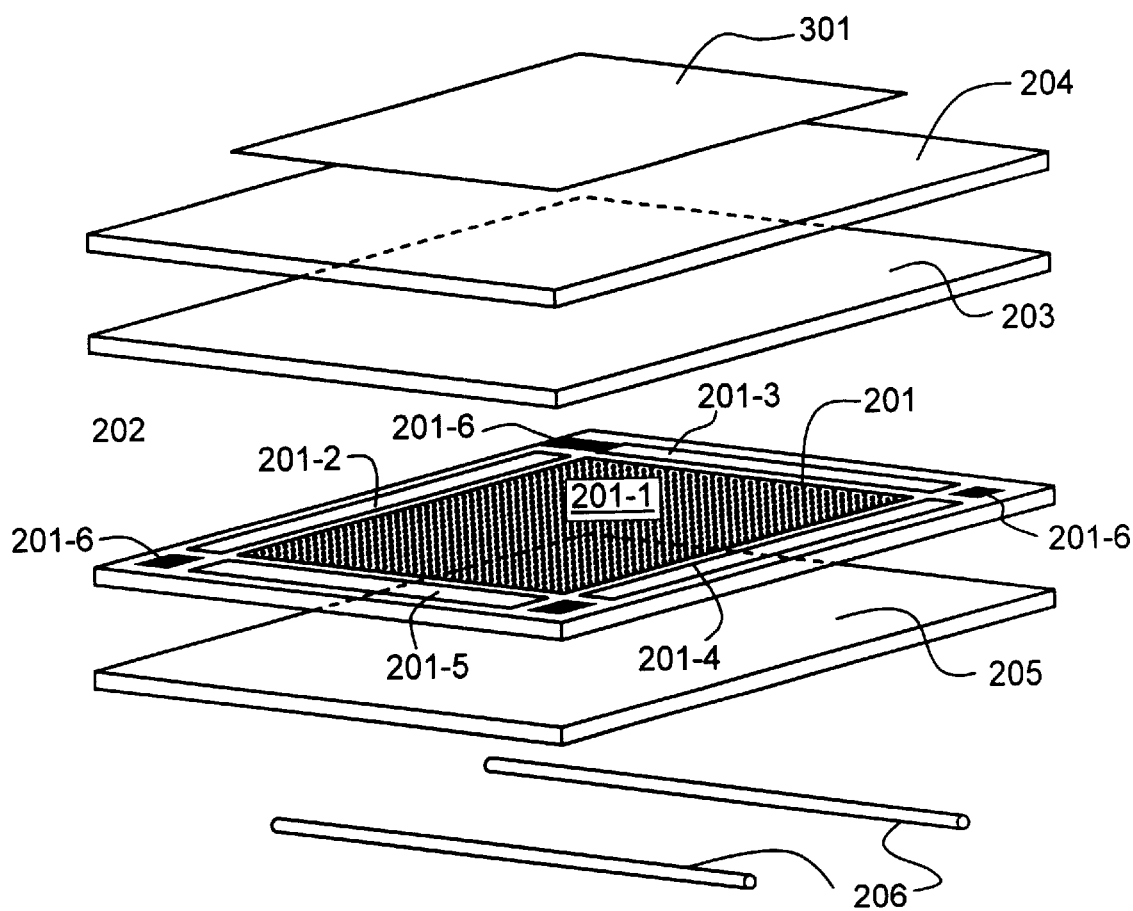
FIG. 3 is an analytic view of a semiconductor device of the present invention.

FIGS. 2 and 3 show the state in which the semiconductor device of the present invention is decomposed into structural parts. In FIGS. 2 and 3, for convenience of explanation, an interval between the respective structural parts is enlarged and is shown. Further, in FIGS. 2 and 3, the semiconductor device of the present invention is used in normally white display (white display when voltage is not applied) of a TN (twisted nematic) mode. A liquid crystal display method of another mode such as an STN mode or an ECB mode may be used. Normally black display (black display when voltage is not applied) may be used.

Reference will be made to FIG. 2. FIG. 2 shows the state of the case where the semiconductor device of the present invention is used in a picture display mode. Reference numeral 201 denotes an active matrix substrate including a matrix circuit 201-1, a pixel source signal line side driver circuit 201-2, a pixel gate signal line side driver circuit 201-3, a sensor horizontal driver circuit 210-4, a sensor vertical driver circuit 201-5, and another peripheral circuit 201-6, which have been described in FIG. 1. Although an oriented film and the like are formed over the active matrix substrate, they are not shown here. Reference numeral 202 denotes a liquid crystal. Reference numeral 203 denotes an opposite substrate, which includes a transparent electrode and an oriented film (both not shown). Reference numerals 204 and 205 denote polarizing plates, which are arranged in crossed Nicols each other. Reference numeral 206 denotes a backlight. Reference numeral 207 schematically denotes a user (user's eye), and indicates the state where the user observes the semiconductor device of the present invention from the above. For the purpose of preventing the polarizing plate from being damaged or being covered with dust, a glass substrate, a plastic substrate, or the like (not shown) is provided on the upper portion of the upper polarizing plate 204.

In the case where the semiconductor device of the present invention is used as the picture display mode, a gradation voltage is supplied to the pixel TFT on the basis of a supplied image signal (it may be a signal stored in a built-in memory or the like, or may be a signal supplied from the outside), and the liquid crystal 202 is driven. Color display can also be made by using a color filter.

Next, reference will be made to FIG. 3. FIG. 3 shows the state of the case where the semiconductor device of the present invention is used in a picture reading mode. With respect to the structural parts constituting the semiconductor device, reference may be made to the explanation of FIG. 2. Reference numeral 301 denotes a picture read object, for example, a business card or a photograph. In FIG. 3, although the picture read object is shown to be separate from the polarizing plate (or not-shown glass substrate or plastic substrate), it is preferable to make arrangement so that the object is in close contact with the plate.

In the case where the semiconductor device of the present invention is used in the picture reading mode, voltage is not applied to the pixel TFT so that the display with all the pixels is made white display. By doing so, light is reflected to the surface of the picture read object 301. The light irradiated to the surface of the picture read object is reflected on the surface of the picture read object 301. At this time, the reflected light includes picture information of the picture read object 301. This reflected light passes through the glass substrate (not shown), the polarizing plate, the opposite substrate, and the liquid crystal, and is detected by the photodiode PD in the sensor portion B of the active matrix circuit of the active matrix substrate, so that conversion into an electric signal is carried out. The picture information converted into the electric signal is taken from the sensor output signal line as described above, and is stored in a memory (it may be formed on the same substrate or may be disposed at the outside). In this way, the picture of the picture read object 301 is captured.

Although the explanation has been made on the case where a business card or a photograph is brought into close contact with the semiconductor device of the present invention, the picture of a scene or a person is taken with a digital camera, and the picture may be captured.

When the picture converted into the electric signal by the sensor portion B is displayed by the pixel region A, it can be displayed almost in real time. The pixel region A may be structured so that data from the outside of the semiconductor device can be displayed.

Figure 4:
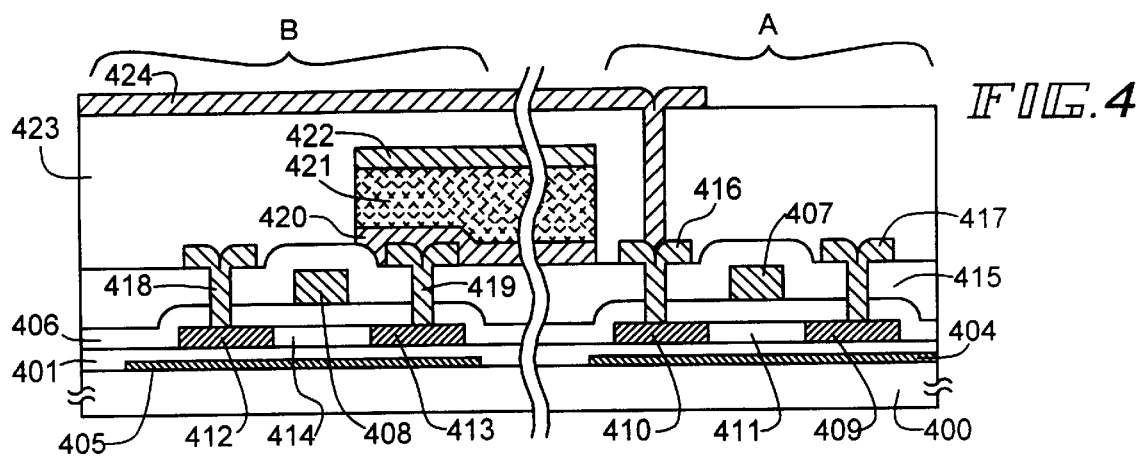
FIG. 4 is a sectional view of an active matrix substrate of a semiconductor device of an embodiment of the present invention.

Next, a sectional structure of the active matrix substrate of the semiconductor device of the present invention will be described. Reference will be made to FIG. 4. The active matrix substrate of the semiconductor device of the present invention includes, as shown in FIG. 2, the pixel region A and the sensor portion B in one pixel. FIG. 4 shows a pixel TFT and a sensor TFT. A light shielding film 404 is disposed on a substrate 400 to make such a structure that the pixel TFT is protected against light incident from the back surface of the substrate. As shown in the drawing, such a structure may be adopted that a light shielding film 405 is disposed for the sensor TFT at the side of the sensor portion B. Moreover, a light shielding film (not shown) may be disposed also for a reset TFT or signal amplifying TFT (both not shown) of the sensor portion B. These light shielding films may be directly disposed on the back surface of the substrate 400.

After an underlayer film 401 is formed on the light shielding films 404 and 405, the pixel TFT of the display portion A, the sensor TFT of the sensor portion B, the signal amplifying TFT, the reset TFT, and TFTs constituting the driver circuit and peripheral circuit are manufactured at the same time. Here, the back surface of the substrate 400 indicates a substrate surface on which TFTs are not formed. The structure of the TFT may be a top gate type or a bottom gate type. FIG. 4 shows the case of the top gate type TFT as an example.

A lower electrode 420 connected to an electrode 419 of the sensor TFT is provided. This lower electrode 420 serves as a lower electrode of a photodiode (photoelectric conversion element), and is formed in the pixel region other than the upper portion of the pixel TFT. A photoelectric conversion layer 421 is disposed on the lower electrode 420, and further, an upper electrode 422 is disposed thereon, so that the photodiode is completed. A transparent electrode is used for the upper electrode 422.

On the other hand, the pixel TFT of the pixel region is provided with a pixel transparent electrode 424 connected to the electrode 416. This pixel transparent electrode may be structured to cover the sensor portion B and a wiring line. In the case of the structure to cover the wiring line, a capacitor is formed with an insulating film, which exists between the wiring line and the pixel transparent electrode, as a dielectric.

A manufacturing process of the semiconductor device of the present invention is substantially the same as manufacturing steps of a conventional display device except that manufacturing steps of the photodiode is added. Thus, since a conventional manufacturing process can be used, the semiconductor device can be manufactured easily and at low cost. Moreover, in the semiconductor device manufactured by the present invention, its shape and size are not changed from a conventional panel even if the sensor function is incorporated. Thus, the semiconductor device can be miniaturized and can be made lightweight.

Next, although preferred embodiments of the present invention will be described in more detail, the present invention is not limited to the following embodiments.

(Embodiment 1)

In this embodiment, an example of a manufacturing method of a semiconductor device of the present invention will be described with reference to FIGS. 5A to 5D and FIGS. 6A to 6C. In the following explanation, although a pixel TFT and a sensor TFT will be typically shown, a reset TFT, a signal amplifying TFT, an analog switch, a driver circuit, and a P-channel TFT and an N-channel TFT constituting a peripheral circuit can also be manufactured at the same time.

Reference will be made to FIGS. 5A to 5D. First, an underlayer film 401 is formed on the whole surface of a substrate having transparent properties 400. As the substrate 400, a glass substrate or quartz substrate having transparent properties can be used. As the underlayer film 401, a silicon oxide film with a thickness of 150 nm was formed by a plasma CVD method. In this embodiment, prior to the step of forming the underlayer film, there were provided a light shielding film 404 for protecting the pixel TFT against light from the back surface of the substrate 400, and a light shielding film 405 for protecting the sensor TFT against light from the back surface.

Next, an amorphous silicon film with a thickness of 30 to 100 nm, preferably 30 nm was formed by a plasma CVD method, and a polycrystal silicon film was formed by irradiation of excimer laser light. As a crystallizing method of the amorphous silicon film, a thermal crystallizing method called SPC, an RTA method using irradiation of infrared rays, a method of using thermal crystallization and laser annealing, or the like may be used.

Figure 5A:
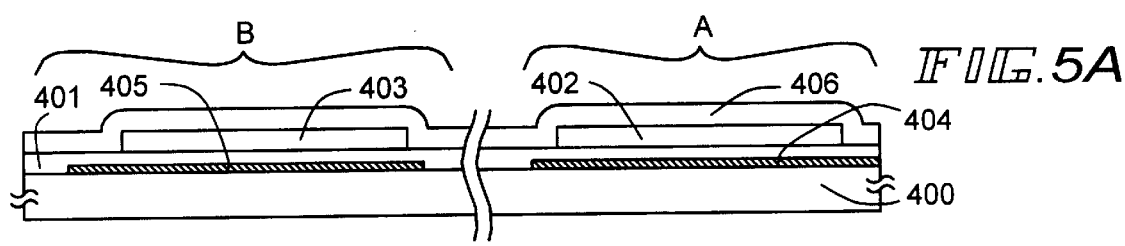
FIGS. 5A to 5D are views showing a manufacturing method of a semiconductor device of the present invention.

Next, the polycrystal silicon film is patterned to form an island-like semiconductor layer 402 having a source region, a drain region, and a channel formation region of the pixel TFT, and an island-like semiconductor layer 403 having a source region, a drain region, and a channel formation region of the sensor TFT. Then a gate insulating film 406 covering these semiconductor layers 402 and 403 is formed. The gate insulating film 406 is formed to have a thickness of 100 nm by a plasma CVD method using silane ($SiH_4$) and $N_2O$ as a raw material gas (FIG. 5A).

Next, a conductive film is formed. Here, aluminum is used as a conductive film material. However, a film containing titanium or silicon as its main ingredient, or a laminate film of those may be used. In this embodiment, an aluminum film with a thickness of 200 to 500 nm, typically 300 nm is formed by a sputtering method. For the purpose of suppressing occurrence of hillocks and whiskers, scandium (Sc), titanium (Ti), or yttrium (Y) of 0.04 to 1.0 wt % is made contained in the aluminum film.

Next, a resist mask is formed and the aluminum film is patterned to form electrode patterns, so that a pixel TFT gate electrode 407 and a sensor TFT gate electrode 408 are formed.

Figure 5B:
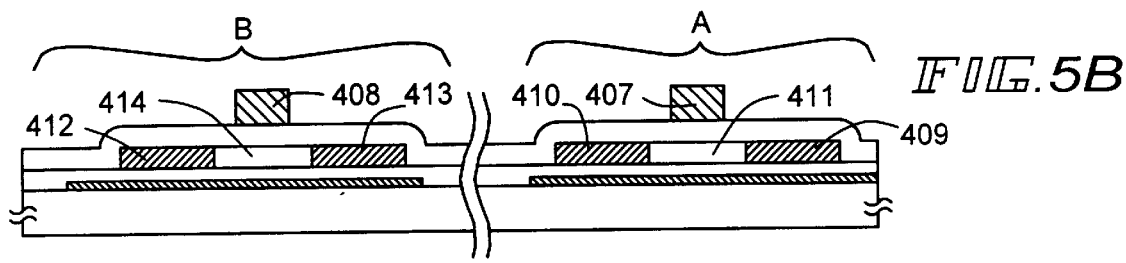

Next, an offset structure is formed by a well known method. Further, an LDD structure may be formed by a well known method. In this way, impurity regions (source/drain regions) 409, 410, 412 and 413, and channel regions 411 and 414 are formed (FIG. 5B). In FIGS. 5A to 5D, for convenience of explanation, only the sensor TFT and the pixel TFT, which are N-channel TFTs, are shown. However, P-channel TFTs are also manufactured. As an impurity element, P (phosphorus) or As (arsenic) may be used for an N-channel type, and B (boron) or Ga (gallium) may be used for a P type.

Then a first interlayer insulating film 415 is formed, and contact holes reaching the impurity regions 409, 410, 412, and 413 are formed. Thereafter, a metal film is formed and patterning is made, so that electrodes 416 to 419 are formed. At this time, wiring lines for connecting a plurality of TFTs are formed at the same time.

In this embodiment, the first interlayer insulating film 415 is formed of a silicon nitride film with a thickness of 500 nm. As the first interlayer insulating film 415, a silicon oxide film or a silicon nitride oxide film may be used other than the silicon nitride film. A multilayer film of these insulating films may be used.

As the metal film as a starting film of the electrodes and wiring lines, in this embodiment, a laminate film composed of a titanium film, an aluminum film, and a titanium film is formed by a sputtering method. The thicknesses of these films are made 100 nm, 300 nm, and 100 nm, respectively.

Figure 5C:
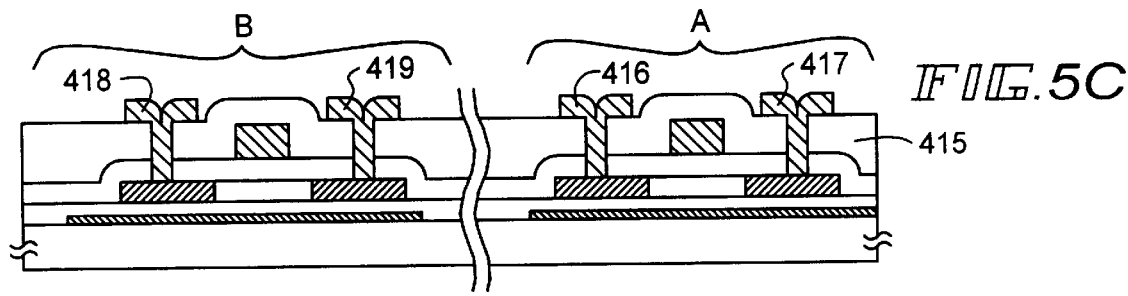
Figure 5D:
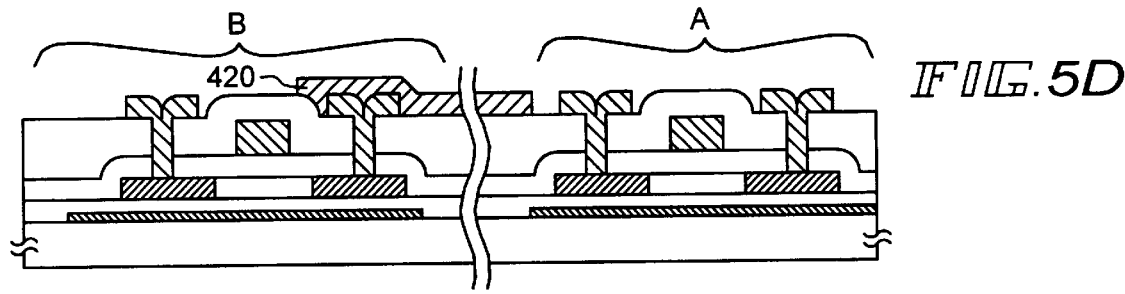

Through the above process, the pixel TFT and the sensor TFT are completed at the same time (FIG. 5C).

Next, a metal film 420 being in contact with the first interlayer insulating film 415 and the drain electrode 419 of the sensor TFT is formed. The metal film is grown and is patterned, so that a lower electrode 420 of a photoelectric conversion element is formed. In this embodiment, although aluminum with a sputtering method is used for the metal film, other metals may be used. For example, a laminate film composed of a titanium film, an aluminum film, and a titanium film may be used.

Figure 6A:
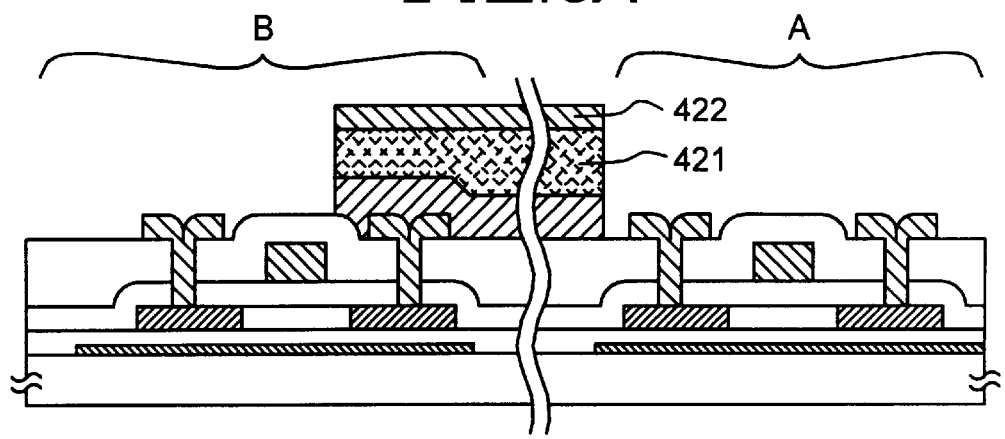
FIGS. 6A to 6C are views showing the manufacturing method of the semiconductor device of the present invention.
Figure 6B:
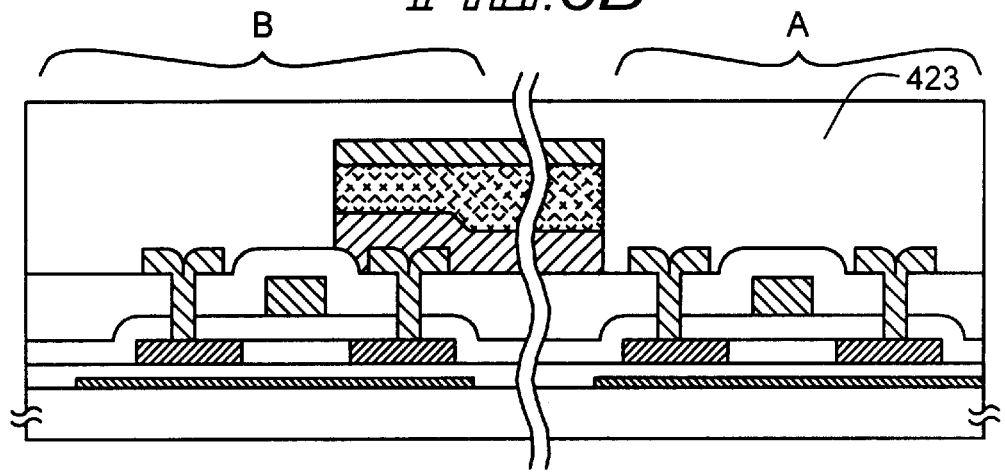
Figure 6C:
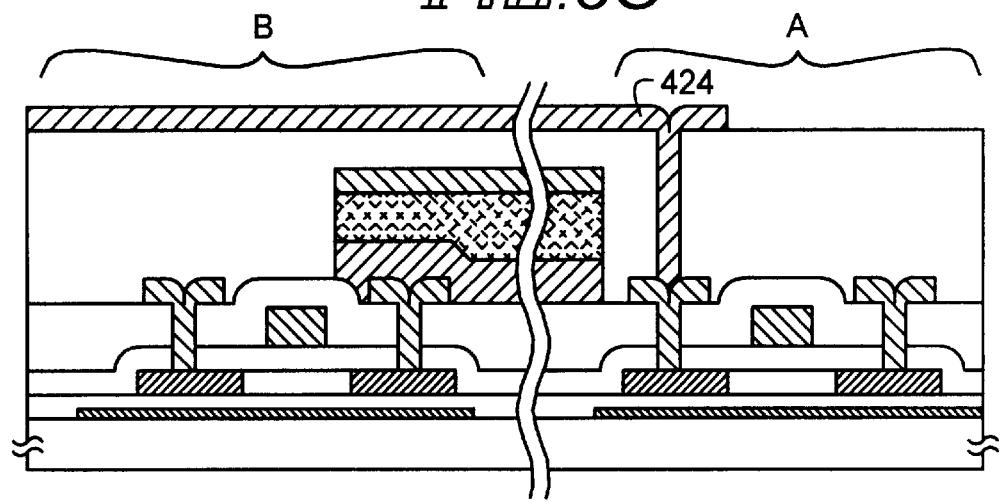

Reference will be made to FIGS. 6A to 6C. Next, an amorphous silicon film (hereinafter referred to as a—Si:H film) containing hydrogen, which functions as a photoelectric conversion layer, is formed on the entire surface of the substrate, and patterning is carried out to form a photoelectric conversion layer 421 (FIG. 6A).

Next, a transparent conductive film is formed on the entire surface of the substrate. In this embodiment, ITO with a thickness of 200 nm is formed as the transparent conductive film by a sputtering method. The transparent conductive film is patterned so that an upper electrode 422 is formed (FIG. 6A).

Then a second interlayer insulating film 423 is formed. When a resin film of polyimide, polyamide, polyimide amide, acryl, or the like is formed as an insulating coat constituting the second interlayer insulating film, a flat surface can be obtained, so that the resin film is preferable. Alternatively, a laminated structure may be adopted such that the upper layer of the second interlayer insulating film is the foregoing resin film, and the lower layer is a single layer or multilayer film of inorganic material such as silicon oxide, silicon nitride, or silicon nitride oxide. In this embodiment, a polyimide film with a thickness of 0.7 $\mu$m was formed as the insulation coat on the entire surface of the substrate (FIG. 6B).

Further, a contact hole reaching the drain electrode 416 is formed in the second interlayer insulating film 423. Again, a transparent conductive film is formed on the entire surface of the substrate and patterning is carried out, so that a pixel transparent electrode 424 connected to the pixel TFT is formed.

Through the above steps, a component substrate as shown in FIG. 6C or FIG. 4 is completed.

The component substrate and an opposite substrate are bonded to each other with a sealing material, and a liquid crystal is sealed therebetween, so that the semiconductor device is completed. This opposite substrate is composed of a transparent substrate on which a transparent conductive film and an oriented film are formed. Other than these, a black mask or a color filter may be provided as the need arises.

(Embodiment 2)

In this embodiment, the pixel electrode in the embodiment 1 is made a reflecting electrode made of a metal film, so that a semiconductor device including a reflecting display portion is manufactured.

Figure 7:
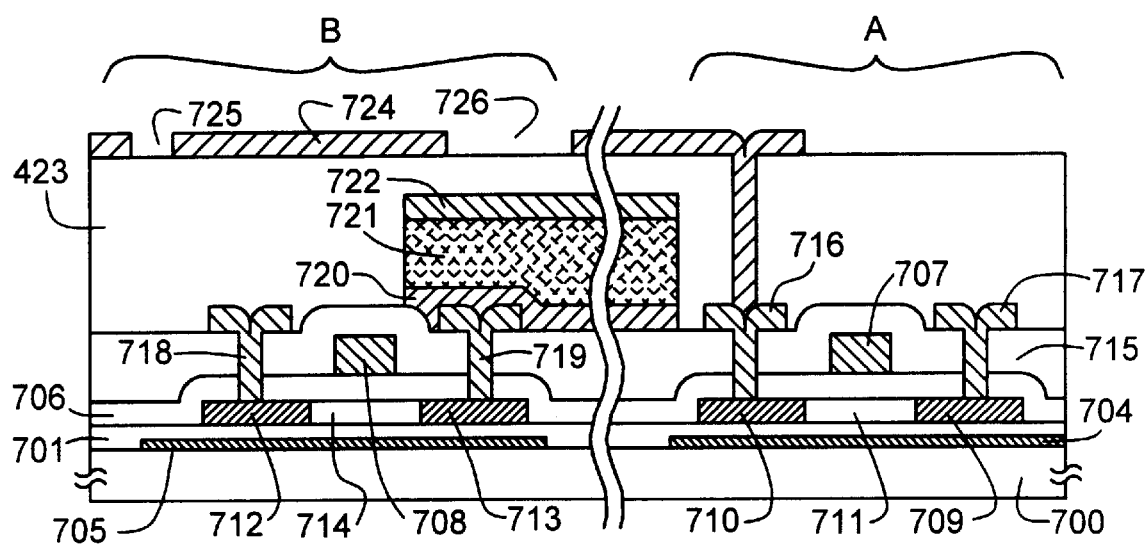
FIG. 7 is a sectional view of an active matrix substrate of a semiconductor device of an embodiment of the present invention.

FIG. 7 is a sectional view of an active matrix substrate of a semiconductor device of this embodiment. Similarly to FIG. 4, FIG. 7 shows a cross section of a pixel region A and a sensor portion B. Reference numeral 700 denotes a substrate, 701 denotes an underlayer film, 704 denotes a protective light shielding film of a pixel TFT, 705 denotes a protective light shielding film of a sensor TFT, 706 denotes a gate insulating film, 707 and 708 denote gate electrodes, 709, 710, 712, and 713 denote impurity regions (source/drain regions), 711 and 714 denote channel regions, 715 denotes a first interlayer insulating film, 716 to 719 denote electrodes (source/drain electrodes), 720, 721, and 722 denote a lower electrode, a photoelectric conversion layer, an upper transparent electrode of a photodiode, respectively, 723 denotes a second interlayer insulation film, and 724 denotes a reflecting electrode of the pixel TFT. Reference numerals 725 and 726 denote windows (holes) provided in the reflecting electrode. Light of a backlight from the lower portion of the active matrix substrate passes through these windows toward the upper portion of the semiconductor device. Reflected light from an object to be read passes through the window 726 and is incident on the photodiode.

A transparent conductive film material or transparent resin film may be formed on the windows 725 and 726.

Thus, in the case of the semiconductor device of this embodiment, a liquid crystal is driven in an ECB mode and is made normally black. In the case of this embodiment as well, in the case of a picture reading mode, the display is made white display. Even in the case where the liquid crystal is driven by another driving mode, in the case of the picture reading mode, the display is made white display.

With respect to a manufacturing method of the semiconductor device of this embodiment, reference may be made to the embodiment 1.

As described above, the manufacturing process of the semiconductor device of the present invention is the same as that of a conventional display device except the addition of the manufacturing step of a photoelectric conversion element. Thus, since a conventional manufacturing process can be used, the semiconductor device can be manufactured easily and at low cost. Moreover, in the semiconductor device manufactured in the present invention, the shape and size of the substrate is not changed from a conventional panel even if the sensor function is incorporated. Thus, the device can be miniaturized and its weight can be lessened.

Moreover, the light receiving area of the sensor cell is substantially the same as the pixel area of the display cell, and is larger as compared with a single crystal CCD, so that the sensor of the present invention can be made highly sensitive. Moreover, electric power consumed by the image sensor of the semiconductor device of the present invention can be made lower as compared with a CCD structure.

What is claimed is:

1. A semiconductor device comprising:
   a display portion and an image sensor portion on a substrate, wherein a plurality of cells are formed on the substrate in a matrix form, each of said cells comprising a pixel portion having at least a pixel TFT and a pixel electrode and a sensor portion having at least a sensor TFT and a photoelectric conversion element;
   a pixel source driver circuit and a pixel gate driver circuit connected to the pixel TFT and formed on the substrate; and
   a sensor horizontal driver circuit and a sensor vertical driver circuit connected to the sensor TFT and formed on the substrate,
   wherein the photoelectric conversion element is located over the pixel UT and the sensor TFT, and under the pixel electrode,
   wherein said pixel electrode comprises reflective material and has at least one window therein facing said photoelectric conversion element.

2. A device according to claim 1, further comprising a backlight provided on a back surface of the substrate.

3. A device according to claim 1, wherein the sensor portion further has a reset TFT and a signal amplifying TFT on the substrate.

4. A device according to claim 1, wherein each of the pixel TFT and the sensor TFT comprises a crystalline semiconductor film formed over the substrate as an active layer.

5. A device according to claim 1, wherein a lower electrode of the photoelectric conversion element is connected to one of source and drain electrodes of the sensor TFT.

6. A semiconductor device comprising:
   a display portion and an image sensor portion on a substrate, wherein a plurality of cells are formed on the substrate in a matrix form, each of said cells comprising a pixel portion having at least a pixel TFT and a pixel electrode and a sensor portion having at least a sensor TFT and a photoelectric conversion element;

a pixel source driver circuit and a pixel gate driver circuit connected to the pixel TFT and formed on the substrate; and a sensor horizontal driver circuit and a sensor vertical driver circuit connected to the sensor TFT and formed on the substrate, wherein the pixel electrode is reflective and has at least one window therein facing said photoelectric conversion element, wherein the photoelectric conversion element is located over the pixel TFT and the sensor TFT and under the pixel electrode, and wherein the pixel TFT and the sensor TFT are formed on a same layer on the substrate.

7. A device according to claim 6, further comprising a backlight provided on a back surface of the substrate.

8. A device according to claim 6, wherein the sensor portion further has a reset TFT and a signal amplifying TFT on the substrate.

9. A device according to claim 6, wherein each of the pixel TFT and the sensor TFT comprises a crystalline semiconductor film formed over the substrate as an active layer.

10. A device according to claim 6, wherein a lower electrode of the photoelectric conversion element is connected to one of source and drain electrodes of the sensor TFT.

11. A semiconductor device comprising:

a display portion and an image sensor portion on a substrate, wherein a plurality of cells are formed on the substrate in a matrix form, each of said cells comprising a pixel portion having at least a pixel TFT and a pixel electrode and a sensor portion having at least a sensor TFT and a photoelectric conversion element;

a pixel source driver circuit and a pixel gate driver circuit connected to the pixel TFT and formed on the substrate; and a sensor horizontal driver circuit and a sensor vertical driver circuit connected to the sensor TFT and formed on the substrate, wherein the pixel electrode is reflective and has at least one window therein facing said photoelectric conversion element, wherein the pixel TFT and the sensor TFT are formed over light shielding films, respectively, and wherein the photoelectric conversion element is formed over the pixel TFT and the sensor TFT and under the pixel electrode.

12. A device according to claim 11, further comprising a backlight provided on a back surface of the substrate.

13. A device according to claim 11, wherein the sensor portion further has a reset TFT and a signal amplifying TFT on the substrate.

14. A device according to claim 11, wherein each of the pixel TFT and the sensor TFT comprises a crystalline semiconductor film formed over the substrate as an active layer.

15. A device according to claim 11, wherein a lower electrode of the photoelectric conversion element is connected to one of source and drain electrodes of the sensor TFT.

16. A semiconductor device comprising:

a display portion and an image sensor portion on a substrate, wherein a plurality of cells are formed on the substrate in a matrix form, each of said cells comprising a pixel portion having at least a pixel TFT and a pixel electrode and a sensor portion having at least a sensor TFT and a photoelectric conversion element, wherein a pixel driver circuit and a sensor driver circuit are on the same substrate, wherein the photoelectric conversion element is formed over the pixel TFT and the sensor TFT and under the pixel electrode, and wherein said pixel electrode comprises reflective material and has at least one window therein Pacing said photoelectric conversion element.

17. A device according to claim 16, further comprising a backlight provided on a back surface of the substrate.

18. A device according to claim 16, wherein the sensor portion further has a reset TFT and a signal amplifying TFT on the substrate.

19. A device according to claim 16, wherein each of the pixel TFT and the sensor TFT comprises a crystalline semiconductor film formed over the substrate as an active layer.

20. A device according to claim 16, wherein a lower electrode of the photoelectric conversion element is connected to one of source and drain electrodes of the sensor TFT.

* * * * *

UNITED STATES PATENT AND TRADEMARK OFFICE
CERTIFICATE OF CORRECTION

PATENT NO.    : 6,583,439 B2
DATED         : June 24, 2003
INVENTOR(S)   : Shunpei Yamazaki and Jun Koyama It is certified that error appears in the above-identified patent and that said Letters Patent is hereby corrected as shown below:

Column 8,
Line 47, delete "pixel UT" and insert -- pixel TFT --;

Column 10,
Line 32, delete "Pacing" and insert -- facing --.

Signed and Sealed this

Third Day of August, 2004

JON W. DUDAS
*Acting Director of the United States Patent and Trademark Office*